United States Patent [19]

Talvacchio

[11] Patent Number: 5,084,437
[45] Date of Patent: Jan. 28, 1992

[54] METHOD FOR MAKING HIGH-CURRENT, OHMIC CONTACTS BETWEEN SEMICONDUCTORS AND OXIDE SUPERCONDUCTORS

[75] Inventor: John J. Talvacchio, Churchill, Pa.
[73] Assignee: Westinghouse Electric Corp., Pittsburgh, Pa.
[21] Appl. No.: 486,474
[22] Filed: Feb. 28, 1990
[51] Int. Cl.$^5$ ............... H01L 21/44; H01L 39/12
[52] U.S. Cl. ................... 505/1; 437/189; 437/190; 437/194; 505/701; 505/703; 505/923
[58] Field of Search ............. 505/701, 703, 923, 1; 437/189, 190, 194

[56] References Cited

U.S. PATENT DOCUMENTS 4,913,769  4/1990  Kanda et al. ................ 156/652
4,959,346  9/1990  Mogro-Campero et al. ....... 505/701

FOREIGN PATENT DOCUMENTS 63-318013  12/1988  Japan ................ 505/701
64-25553    1/1989  Japan .
1-030117    2/1989  Japan .
1-111718    4/1989  Japan .
1-276779   11/1989  Japan .
2213838     8/1989  United Kingdom .

OTHER PUBLICATIONS

MAM Gijs et al., "Superconducting Proximity Effect In $Y_1Ba_2Cu_3O_7$-AgPb-Trilayer Structures", *Solid State Comm.* vol. 71, No. 7, pp. 575–577, 1989.
Y. Tzeng, "Fabrication of Electrical Contacts to $VBa_2Cu_3O_{7-x}$ Superconductor by Molten Silver Processing" *J. Electrochem. Soc.*, 135(5), pp. 1309–1310.
E. Ekholm et al., "Alternation and Dispersion for High--Tc Superconducting Microstrip Lines", *IEEE Trans. Microwave Theory Tech.*, vol. 38, No. 4, Apr. 1990, pp. 387–395.

*Primary Examiner*—Brian E. Hearn
*Assistant Examiner*—Laura M. Holtzman
*Attorney, Agent, or Firm*—Daniel P. Cillo

[57] ABSTRACT

This is a method for making an ohmic connection between a semiconductor and oxide superconductor, the connection being such that current can pass between the semiconductor and the superconductor without going through a degraded portion which is greater than the coherence length of the superconductor. The method can comprise depositing a buffer layer (which is essentially inert to the oxide superconductor) on a first portion of a semiconductor substrate, and depositing oxide superconductor on the barrier layer, and depositing a superconductor contact layer (e.g. of gold or silver) on the oxide superconductor, and depositing a semiconductor contact layer on a second portion of the semiconductor substrate (the semiconductor contact layer being, for example, of aluminum, or a refractory metal silicide); and depositing a layr (e.g. of gold or aluminum) on the semiconductor contact layer and on at least a portion of the superconductor contact layer to electrically connect the semiconductor contact laye and the superconductor contact layer. Alternately, the method can comprise depositing a buffer layer on a first portion of a substrate, and depositing oxide superconductor on the barrier layer, and depositing a superconductor contact layer on the oxide superconductor, and depositing a semiconductor on a second portion of the substrate, and depositing a semiconductor contact layer on the semiconductor, and depositing a layer on the semiconductor contact layer and on at least a portion of the superconductor contact layer to electrically connect the semiconductor contact layer and the superconductor contact layer. Preferably, the superconductor contact layer is of gold, the semiconductor contact layer and the interconnecting layer are of aluminum, and the buffer layer is of zirconium oxide.

10 Claims, 2 Drawing Sheets

METHOD FOR MAKING HIGH-CURRENT, OHMIC CONTACTS BETWEEN SEMICONDUCTORS AND OXIDE SUPERCONDUCTORS

GOVERNMENT CONTRACT

This invention was conceived or first reduced to practice in the course of, or under contract number F49620-88-C-0039 between Westinghouse Electric Corporation and the United Stated Government, represented by the AFOSR.

CROSS REFERENCE TO RELATED APPLICATIONS

A method for preparing, and configuration of, molybdenum resistors in a superconductor integrated circuit are described. In U.S. Pat. No. 4,904,980 (Przybysz et al). That related application uses an aluminum film over the superconductor conductors, but before the molybdenum film which is to be patterned into resistors. The aluminum film provides an aluminum-molybdenum etch stop interface (interface and aluminum film, other than under the molybdenum resistor, are exposed by etching, and are then rendered non-conductive by oxidization). The aluminum-molybdenum etch stop interface protects the patterned superconductor film and any other underlayers and increases processing margins for the etch time.

A method for preparing molybdenum resistors in a superconductor integrated circuit is described in U.S. Pat. No. 5,021,867 (Przybysz), application Ser. No. 359018 filed 5-30-89 (W.E. 55,357). It uses a titanium film on the patterned superconductor film; and then applies a molybdenum film on the titanium film to provide an titanium-molybdenum etch stop interface. The titanium-molybdenum etch stop interface protects the patterned superconductor film and any other underlayers and increases processing margins for the etch time.

An improved method of depositing an oxide superconductor on a substrate is described in related application Ser No. 257918, now abandoned filed 10-14-88 (W.E. 54,793). It utilizes epitaxially growing a 0.05-2.0 micron thick, single crystal buffer layer of magnesia or cubic zirconia on a single crystal sapphire substrate; and then growing an oriented oxide superconductor layer on the buffer layer. The sapphire substrate with a thin buffer layer provides for low dielectric losses (negligibly larger than sapphire by itself), the oxide superconductor can be oriented in a desired direction to provide higher current carrying capacity, and reaction between the sapphire substrate and the oxide superconductor (especially that due to diffusion of aluminum) is minimized. Preferably, the buffer layer is 0.1-1.0 micron thick, magnesia in a (111), or (100), or (110) orientation.

A method for preparing a superconductor integrated circuit is described in U.S. Pat. No. 4,904,341. That related application is an improved method for providing silicon dioxide with openings which expose contact pad areas for connections to superconductors in the preparation of superconducting integrated circuits. The improvement utilizes an etchant gas consisting essentially of 50-95 volume percent nitrogen trifluoride and 5-50 volume percent rare gas (preferably about 77 volume percent nitrogen trifluoride, with argon or neon or mixtures thereof as the rare gas) for the reactive ion etching of the exposed portions of the silicon dioxide film, and thus a carbon-containing etchant is not used and polymer by-products of the etching process are essentially completely avoided.

The preceding applications and patents are all assigned to the same assignee as the instant invention.

BACKGROUND OF THE INVENTION

In 1986, Bednorz and Muller initiated a series of discoveries of new high-Tc oxide superconductors when they found a Tc of about 30K in $La_{1.85}Ba_{0.15}CuO_4$. The current highest-Tc compound is in the Tl-Ba-Ca-Cu-O system where the transition to zero resistance occurs at 125K. The earlier superconductors had generally been of Nb and its alloys and compounds. The newer category includes compounds discovered in 1988 in three different materials systems. It appears that the relevant properties of the Bi-Sr-Ca-Cu-O and Tl-Ba-Ca-Cu-O sets of compounds are similar to those of the rare-earth-Ba-Cu oxides, typified by $YBa_2Cu_3O_7$ (YBCO), so YBCO will be used to represent the high-Tc oxide superconductors. Relatively little is known about the third new superconductor, $Ba_{0.6}K_{0.4}BiO_3$, except that—unlike the higher-Tc compounds—it has a cubic structure and (presumably) isotropic properties.

The discovery of oxide superconductors with transition temperatures, Tc, greater than the boiling point of liquid nitrogen, 77K, has opened new possibilities for hybrid semiconductor/superconductor circuits. One of the possible applications is to use low-loss, dispersionless superconducting striplines as interconnects in semiconductor circuits. As shown in FIG. 1, the advantages of using superconducting interconnects in place of Al to reduce signal delay times are greatest for the longest interconnection paths. The present obstacle to developing such applications is the inability to grow high-Tc films, typified by $YBa_2Cu_3O_7$ (YBCO), on silicon wafers without having a thick, insulating interface layer that prevents current transfer. The formation of a degraded substrate/film interface layer is a general problem in the growth of superconducting films. The origin is often reaction and interdiffusion with the substrate at temperatures needed to crystallize the superconducting film. At sufficiently low deposition temperatures, reaction with the substrate can be eliminated but crystalline disorder in the superconductor lowers Tc. Table 1 is a summary of the film thickness, $d_c$, needed to obtain 75% of the Tc found in bulk superconductors compared to the superconducting coherence length, which is the minimum distance over which the Tc can vary from its full value to zero.

TABLE 1

Minimum thickness, $d_c$, required for non-epitaxial and epitaxial films to obtain >75% of the Tc found in bulk samples.

| Superconductor | Required Fabrication Temp. (°C.) | $d_c$ (nm) (Non-epitaxial) | $d_c$ (nm) (Epitaxial) | $\xi$ (nm) ($\parallel$ Cu—O.) |
|---|---|---|---|---|
| Pb | 20 | 3 | — | 90 |
| Nb | 20–800 | 25 | 5 | 40 |
| NbN | 50–700 | 15 | <1 | 4 |
| Nb3Sn | 750–950 | 25 | 8 | 3 |
| YBCO | 600–900 | 400 | ∞ | 3.1, 0.4 |
| Bi—Sr—Ca—Cu—O | 870 | — | — | 3.1, 0.4 |

Table 1 shows that $d_c <$ coherence length for Pb and Nb and for NbN only in the case of epitaxial film growth. Therefore, if these films are grown on a metallic substrate, the substrate/film interface will be strongly superconducting. The contact formed in this manner can be expected to have zero resistance up to a critical current density, Jc, on the same order as bulk Pb or Nb. In contrast, YBCO films must be much thicker than a coherence length to obtain high Tc's. The standard approach to try to reduce $d_c$ for YBCO is to lower the film deposition temperature (or formation temperature for amorphous YBCO films that are post-annealed to become superconducting). Deposition temperatures have been lowered in a number of laboratories to about 600° C. Some reports of successful growth at 400° C. have been made, but there are questions about how accurately temperature was measured in those cases. The relatively low deposition temperatures have permitted growth directly on Si or on Si coated with a buffer layer, typically $ZrO_2$. Although these efforts have reduced substrate/YBCO reaction, they have not resulted in sufficient crystalline order to lower $d_c$ below the values listed in Table 1. There is no prospect of a metallic buffer layer that will perform better than the insulating buffer layers that currently give the best results.

Since the problems related to large $d_c$ have not been solved, the only low-resistance contacts made to YBCO films have been made with Au contacting the top surface of the film. Techniques for forming these contacts at 20° C. have been published. Other techniques have also resulted in low contact resistances for samples heated to >300° C.

It is not only degradation of the superconductor that must be considered in semiconductor/superconductor hybrids. Overall processing temperatures must be kept low enough to prevent diffusion profiles from changing in semiconductor devices. Deposition temperatures for YBCO of about 600° C. are low enough to be compatible with Si circuits, but are too high or, at best, marginal for GaAs, which starts to decompose at 580° C.

Contacts between most semiconductors and metals are rectifying. For Si, the standard metal for ohmic contacts is Al. While there are other suitable metals, the choice of metals for contacts is severely constrained. Unfortunately, Al is a particularly reactive metal in contact with YBCO.

SUMMARY OF THE INVENTION

High-current, ohmic contacts between semiconductors and high-transition-temperature oxide superconductors are needed to develop a semiconductor/superconductor hybrid technology. The problem is that the two materials react at the temperatures needed for fabrication, and form a thick, degraded interface layer. Various types of buffer layers have been tried, but none appears to be very promising. In this invention, the degraded interface layer is avoided by using a normal metal "bridge" to connect the top surface of a superconductor deposited on one region of a semiconductor and the top surface of an ohmic, normal-metal deposited on an adjacent region.

This is a method for making contacts between a semiconductor and oxide superconductor. This method provides an ohmic connection between the semiconductor and the oxide superconductor, the connection being such that current can pass between the semiconductor and the superconductor without going through a degraded portion which is greater than the coherence length of the superconductor. The method can comprise (see FIG. 2) depositing a buffer layer (which is essentially inert to the oxide superconductor) on a first portion of a semiconductor substrate, and depositing oxide superconductor on the barrier layer, and depositing a superconductor contact layer (of at least one of gold and silver) on the oxide superconductor, and depositing a semiconductor contact layer on a second portion of the semiconductor substrate (the semiconductor contact layer is of at least one of aluminum, titanium, chromium, or a refractory metal silicide); and depositing a layer (of at least one of gold, silver, aluminum, titanium, chromium, or a refractory metal silicide) on the semiconductor contact layer and on at least a portion of the superconductor contact layer to electrically connect the semiconductor contact layer and the superconductor contact layer. The semiconductor contact layer and the interconnecting layer may be of the same material and deposited as a single layer. Alternately, the method can comprise (see FIG. 3) depositing a buffer layer which is essentially inert to the oxide superconductor on a first portion of a substrate (e.g. sapphire), and depositing oxide superconductor on the barrier layer, and depositing a superconductor contact layer (of at least one of gold and silver) on the oxide superconductor, and depositing a semiconductor on a second portion of the substrate, and depositing a semiconductor contact layer on the semiconductor, (the semiconductor contact layer being of at least one of aluminum, titanium, chromium, or a refractory metal silicide) and depositing a layer (of at least one of gold, silver, aluminum, titanium, chromium, or a refractory metal silicide) on the semiconductor contact layer and on at least a portion of the superconductor contact layer to electrically connect the semiconductor contact layer and the superconductor contact layer. This also provides an ohmic connection such that current can pass between the semiconductor and the superconductor without going through a degraded portion which is greater than the coherence length of the superconductor.

Preferably, the superconductor contact layer is of gold, the semiconductor contact layer is of aluminum, the interconnecting layer is of aluminum, and the buffer layer is of zirconium oxide. Preferably, the semiconductor contact layer and the interconnecting layer are made as a single layer.

BRIEF DESCRIPTION OF THE DRAWINGS

The invention as set forth in the claims will become more apparent by reading the following detailed description in conjunction with the accompanying drawings, wherein like reference numerals refer to like parts through the drawings and in which:

DESCRIPTION OF THE PREFERRED EMBODIMENT

Figure 1:
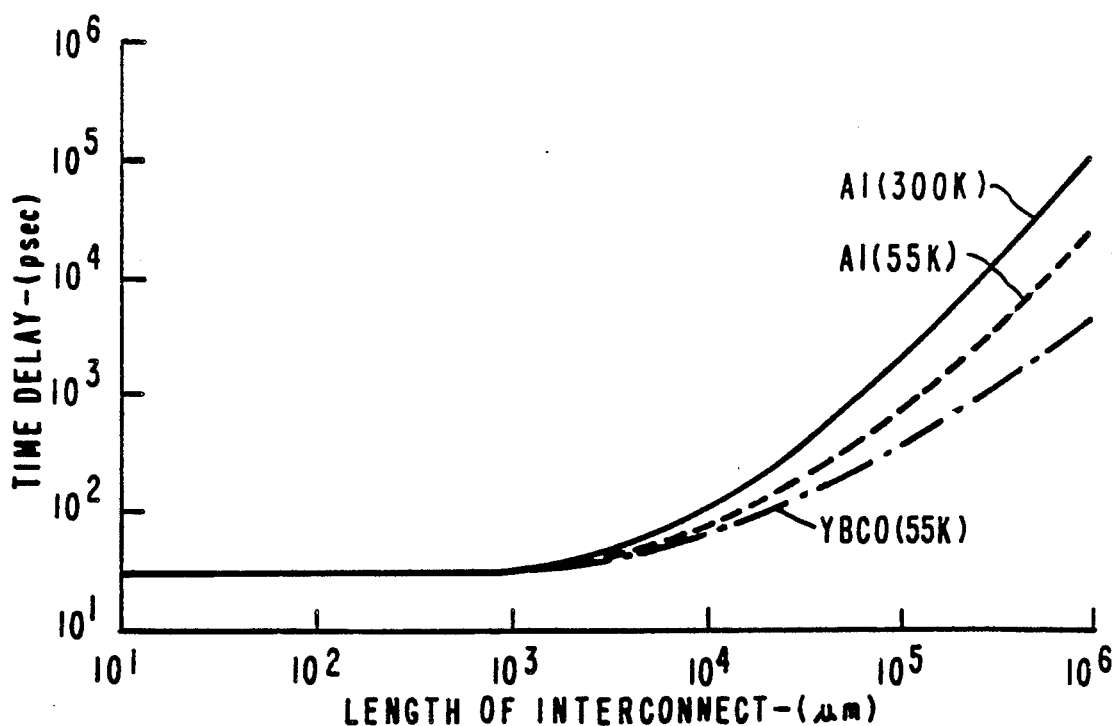
FIG. 1 shows the time delay dependence of signal propagation versus interconnect length calculated using the following assumptions: 30 mm wide HEMT driver, and ½ mm design rules (from a presentation by R. Withers of Lincoln Laboratory)
Figure 2A:
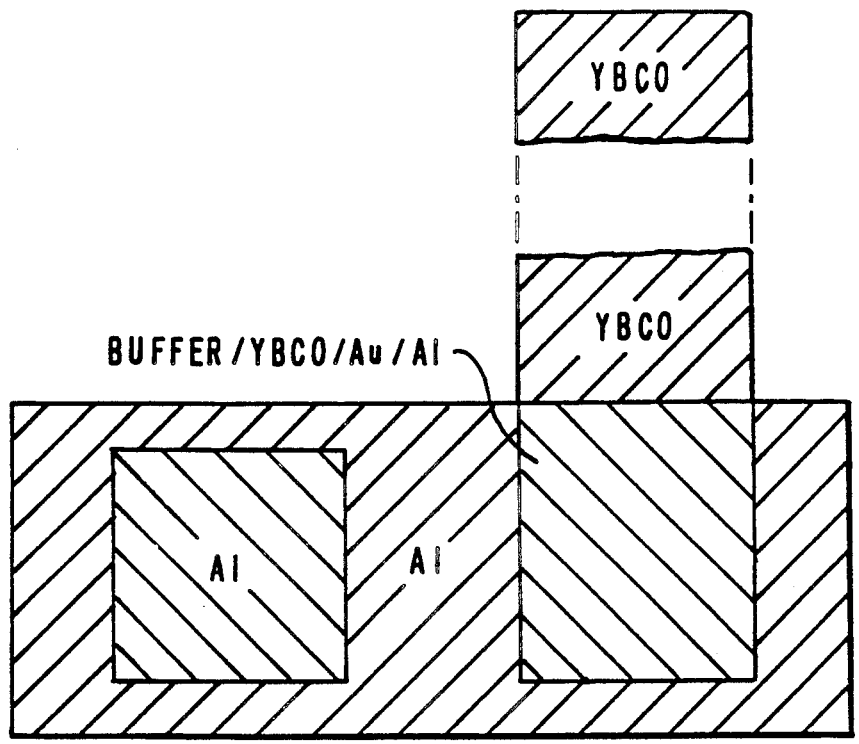
FIG. 2 shows the geometry for these contacts in a top view in FIG. 2(a) and in cross-section in FIG. 2(b), where the completed structure shown in FIG. 2(b) has a Au "bridge" connecting the top surface of a YBCO stripline to the top surface of a normal metal that forms an ohmic contact to Al.
Figure 2B:
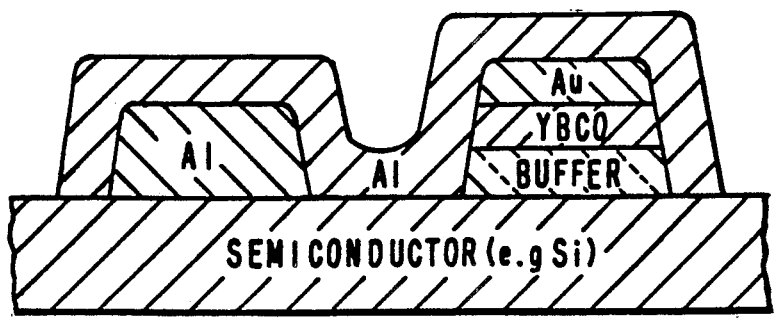

This invention avoids the problems associated with large $d_c$ and broadens the choices for a metal that can form ohmic contacts. As noted above, the geometry for these contacts is shown in a top view FIG. 2(a) and in cross-section in FIG. 2(b), and the completed structure shown in FIG. 2(b) has a Au "bridge" connecting the top surface of a YBCO stripline to the top surface of a normal metal that forms an ohmic contact to Al. Although specific materials are shown in FIG. 2, the invention is more general. For example, other normal metals could be used in place of Al and Au. No scale is given for FIG. 2 because the design does not depend on a specific contact area. However, typical lateral dimensions for contacts would be on the scale of a few micrometers. The YBCO stripline would presumably be much longer or else, as shown in FIG. 1, there is little advantage in its use. The calculations in FIG. 1 show that there is no significant disadvantage to adding a few micrometers of normal-metal stripline in series with the superconductor at each contact.

The advantages of using this structure over the direct contact between the bottom of the YBCO film and Si are:

1. Whichever normal metal is judged to be most compatible with the semiconductor can be used.
2. Any buffer layer can be used between the semiconductor and superconductor that serves as a good substrate for superconductor film growth. In particular, epitaxial $ZrO_2$ grown on Si can be used to grow epitaxial YBCO(001).
3. Low-resistance contacts between Au and the top surface of YBCO have already been demonstrated. In fact, suitable properties have been demonstrated for each interface shown in FIG. 2.

Figure 3:
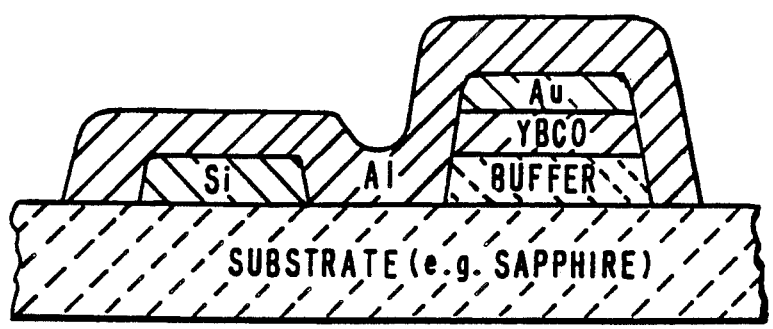
FIG. 3 shows the alternate geometry for these contacts in cross-section.

The order of deposition and processing of the structure does not need to be specified. The various layers as labeled in FIG. 2 are sufficiently rugged that processing temperatures up to about 600° C. can be used at any step of the process. Of course, the particular choice of materials might require that the superconductor must be fabricated before the ohmic contact to the semiconductor is made or vice versa. As noted in the Summary (above), this method can produce the configuration of FIG. 2 or FIG. 3.

Preferably the method comprises: a) depositing a buffer layer which is essentially inert to the oxide superconductor on a first portion of a semiconductor substrate, and depositing oxide superconductor on the barrier layer, and depositing a superconductor contact layer of gold on the oxide superconductor, and depositing a semiconductor contact layer of aluminum on a second portion of the semiconductor substrate; and then b) depositing an interconnecting layer of aluminum on the semiconductor contact layer and on the superconductor contact layer to electrically connect the semiconductor contact layer and the superconductor contact layer. Preferably, the semiconductor contact layer and the interconnecting layer are of the same material (e.g. aluminum or gold) and are deposited in a single deposition step. Preferably the buffer layer is of zirconium oxide.

While the preferred embodiments described herein set forth the best mode to practice this invention presently contemplated by the inventor, numerous modifications and adaptations of this invention will be apparent to others skilled in the art. Therefore, the embodiments are to be considered as illustrative and exemplary and it is understood that numerous modifications and adaptations of the invention as described in the claims will be apparent to those skilled in the art. Thus, the claims are intended to cover such modifications and adaptations as they are considered to be within the spirit and scope of this invention.

What is claimed is:

1. A method for making ohmic contacts between a semiconductor and a high Tc Cu-oxide material having superconducting capability, in which current can pass between the semiconductor and the Cu-oxide material without going through a degraded interface; said method comprising the steps:
   a) depositing a buffer layer which is essentially inert to Cu-oxide material on a first portion of a semiconductor substrate which comprises silicon, and depositing a high Tc Cu-oxide material having superconducting capability on said buffer layer, and depositing a first contact layer of gold on said Cu-oxide material, and depositing a second contact layer on a second portion of said semiconductor substrate, said second contact layer being of aluminum; and then
   b) depositing an interconnecting layer of at least one of gold, silver, aluminum, titanium, chromium, or a refractory metal silicide on said second contact layer and on at least a portion of said first contact layer, to electrically connect said second contact layer and said first contact layer.

2. The method of claim 1, wherein said buffer layer is of zirconium oxide.

3. The method of claim 1, wherein said second contact layer and said interconnecting layer are the same material and deposited in a single deposition step.

4. The method of claim 1, wherein the deposition occurs at up to 600° C., and the Cu-oxide comprises a rare earth Ba-Cu oxide.

5. The method of claim 1, where the Cu-oxide is $YBa_2Cu_3O_7$, and the interconnection layer is aluminum.

6. A method for making ohmic contacts between a semiconductor and a high Tc Cu-oxide material having superconducting capability, in which current can pass between the semiconductor and the Cu-oxide material without going through a degraded interface; said method comprising the steps:
   a) depositing a buffer layer which is essentially inert to Cu-oxide material on a first portion of a substrate, and depositing a high Tc Cu-oxide material having superconducting capability on said buffer layer, and depositing a first contact layer of gold on said Cu-oxide material, and depositing a semiconductor which comprises silicon on a second portion of said substrate, and depositing a second contact layer on said semiconductor, said second contact layer being of aluminum; and then
   b) depositing an interconnecting layer of at least one of gold, silver, aluminum, titanium, chromium, or a refractory metal silicide on said second contact layer and on at least a portion of said first contact layer, to electrically connect said second contact layer and said first contact layer.

7. The method of claim 6, wherein said buffer layer is of zirconium oxide.

8. The method of claim 6, wherein said second contact layer and said interconnecting layer are the same material and deposited in a single deposition step.

9. The method of claim 6, wherein the deposition occurs at up to 600° C., and the Cu-oxide comprises a rare earth Ba-Cu oxide.

10. The method of claim 6, where the Cu-oxide is $YBa_2Cu_3O_7$, and the interconnection layer is aluminum.

* * * * *